(12) United States Patent
Leonardo et al.

(10) Patent No.: US 7,932,747 B2
(45) Date of Patent: Apr. 26, 2011

(54) CIRCUIT ARRANGEMENT AND METHOD FOR SHIFTING A VOLTAGE LEVEL

(75) Inventors: Vincenzo Leonardo, Wädenswil (CH); Mark Niederberger, Einsiedeln (CH)

(73) Assignee: austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 12/739,939

(22) PCT Filed: Oct. 15, 2008

(86) PCT No.: PCT/EP2008/008740
§ 371 (c)(1),
(2), (4) Date: Aug. 3, 2010

(87) PCT Pub. No.: WO2009/052982
PCT Pub. Date: Apr. 30, 2009

(65) Prior Publication Data
US 2010/0295576 A1    Nov. 25, 2010

(30) Foreign Application Priority Data
Oct. 26, 2007  (DE) .......................... 10 2007 051 313

(51) Int. Cl.
*H03K 19/0175* (2006.01)

(52) U.S. Cl. ................ 326/80; 326/62; 326/63; 326/68

(58) Field of Classification Search ............... 326/62–81; 327/333
See application file for complete search history.

(56) References Cited

U.S. PATENT DOCUMENTS

| | | | |
|---|---|---|---|
| 6,259,302 B1 * | 7/2001 | Phanse et al. ................ 327/362 |
| 6,348,681 B1 | 2/2002 | Kindt et al. | |
| 6,498,738 B1 | 12/2002 | Orita | |
| 2004/0227546 A1 | 11/2004 | Nanba et al. | |
| 2010/0271520 A1 * | 10/2010 | Nakayama .................... 348/302 |

FOREIGN PATENT DOCUMENTS

| | | |
|---|---|---|
| DE | 102 26 066 | 2/2003 |
| EP | 1 646 149 | 4/2006 |

* cited by examiner

*Primary Examiner* — Anh Q Tran
(74) *Attorney, Agent, or Firm* — Cohen Pontani Lieberman & Pavane LLP

(57) ABSTRACT

A circuit arrangement for shifting a voltage level comprises a data-current converter (2) that is connected to a first connection (K1) and that has an input for feeding a digital input data signal (DIN), a first output for providing a current (I), and also a second output for providing a reference current (I1), and a current-data converter (3) that is connected to a second connection (K2) and that has a first input for feeding the current (I), a second input for feeding the reference current (I1), and also an output for providing a digital output data signal (DOUT). Here, a voltage level of the digital output data signal (DOUT) is different from a voltage level of the digital input data signal (DIN). In addition, a method for shifting a voltage level is provided.

16 Claims, 3 Drawing Sheets

CIRCUIT ARRANGEMENT AND METHOD FOR SHIFTING A VOLTAGE LEVEL

RELATED APPLICATIONS

This is a U.S. national stage of application No. PCT/EP2008/008740, filed on Oct. 15, 2008.

This application claims the priority of German application no. 10 2007 051 313.7 filed Oct. 26, 2007, the entire content of which is hereby incorporated by reference.

FIELD OF THE INVENTION

The invention relates to a circuit arrangement and a method for shifting a voltage level.

BACKGROUND OF THE INVENTION

Digital circuits are conventionally operated in a specified power-supply voltage range. It can be desirable to operate a circuit, for example, for test purposes, in an additional voltage range. In order to realize this, it is necessary to shift the voltage level of the data signals processed in the circuit. For this purpose, for a certain number of data signals, a corresponding number of shift elements is typically needed. This leads to an undesired increase in the chip surface area.

SUMMARY OF THE INVENTION

One object of the present invention is to provide an improved circuit arrangement and an improved method that allows the shifting of at least one voltage level and at the same time the saving of chip surface area.

The task is achieved by the circuit arrangement of claim 1 as well as by the method of claim 10. Refinements and further embodiments are the subject matters of the dependent claims.

This and other objects are attained in accordance with one aspect of the present invention directed to a circuit arrangement for shifting a voltage level comprises a data-current converter and a current-data converter. The data-current converter is connected to a first connection of the circuit arrangement and has an input for feeding a digital input data signal, a first output for providing a current, and also a second output for providing a reference current. The current-data converter is connected to a second connection of the circuit arrangement and has a first input for feeding the current, a second input for feeding the reference current, and also an output for providing a digital output data signal. Here, a voltage level of the digital output data signal is different from a voltage level of the digital input data signal.

Shifting can here mean adaptation or adaptation and shifting.

The data-current converter converts the digital input data signal into the current with respect to the reference current. The current and the reference current are transformed to the level range of the digital output data signal. With respect to the reference current, the current-data converter converts the current back into the digital output data signal.

Thus, all of the information of the digital input data signal is contained in the current. Consequently, there is only one information path that is transformed from the level range of the digital input data signal to the level range of the digital output data signal. In comparison to known circuit arrangements and methods, this requires fewer shift elements and thus allows use of less chip surface area.

In one refinement, the digital input data signal is a binary signal and has a first and at least one second binary information value whose logic state zero in each case is represented by a first reference potential applied to the first connection of the circuit arrangement and whose logic state one in each case is represented by a first supply potential applied to a third connection of the circuit arrangement. Here, the first supply potential is higher than the first reference potential.

In another embodiment, the digital output data signal is a binary signal and has a number of binary information values corresponding to the number of binary information values of the digital input data signal. The logic state one of the binary information values of the digital output data signal is represented by a second supply potential applied to the second connection of the circuit arrangement. The logic state zero of the binary information values of the digital output data signal is represented by a second reference potential applied to a fourth connection of the circuit arrangement.

In another embodiment, the data-current converter is designed for providing the current as a function of the reference current and an offset current according to the following rule:

$$I = I2 + E0 * 2^0 * I1 + E1 * 2^1 * I1$$

Here, I represents the current, I1 the reference current, I2 the offset current, E0 the first binary information value of the digital input data signal, and E1 the at least one second binary information value of the digital input data signal.

The current thus comprises all of the information, i.e., the first and the at least one second binary information values, the digital input data signal. Consequently, only the current and the reference current must be transformed to the level range of the digital output data signal.

In one refinement, the current-data converter is designed for providing the first and the at least one second binary information values of the digital output data signal as a function of the current and the reference current according to the following rule:

$$A1 = 1, \text{ if } I \geq 2^1 * I1, \text{ otherwise } A1 = 0$$

$$A0 = 1, \text{ if } I \geq 2^0 * I1 + A1 * 2^1 * I1, \text{ otherwise } A0 = 0$$

Here, A0 and A1 represent the first and the at least one second binary information values of the digital output data signal.

In another embodiment, the current-data converter is designed for providing the digital output data signal as a function of the current and also the reference current. Here, a logic state of the first binary information value of the digital output data signal agrees with a logic state of the first binary information value of the digital input data signal, as well as a logic state of the at least one second binary information value of the digital output data signal agrees with a logic state of the at least one second binary information value of the digital input data signal.

Therefore, the information values of the digital input data signal are shifted to the level range of the digital output data signal while preserving their information.

In one refinement, the current-data converter has a number of current comparators corresponding to the number of provided binary information values of the digital output data signal.

In another embodiment, a high-voltage element is connected before each of the first and the second inputs of the data-current converter for transforming the current and the reference current into the level range of the second supply potential.

Thus, for shifting the voltage level of an arbitrary number of binary information values of the digital input data signal to the level range of the digital output data signal, exactly two high-voltage elements are needed. This allows a significant saving of chip surface area in comparison with conventional circuit arrangements.

In another embodiment, each high-voltage element has at least one component made from a group comprising a transistor and also a cascode circuit with two transistors.

Another aspect of the present invention is directed to a method for shifting a voltage level comprising the conversion of a first and at least one second binary information value of a digital input data signal present in the level range of a first supply voltage with respect to a reference current into a first and at least one second weighted partial current, the addition of the first and the at least one second partial currents into a current, the transformation of the current and the reference current to the level range of a second supply voltage, as well as the back conversion of the current with respect to the reference current into a first and at least one second binary information values of a digital output data signal provided in the level range of the second supply voltage.

In the method, the binary information values in separate data lines of the digital input data signal are converted into the current, so that only this current and the reference current must be transformed to the level range of the second supply voltage. This allows saving of the needed chip surface area.

In one refinement, for transforming the current and the reference current to the range of the second supply voltage, in each case exactly one high-voltage element is used.

Therefore, relative to known methods, significant chip surface area is saved.

In one refinement, each high-voltage element has at least one component from a group comprising a transistor and also a cascode circuit that has two transistors.

In another embodiment, for converting the current back into the digital output data signal, at least one current comparator is used for each of the first and the at least one second binary information values of the digital output data signal.

In another embodiment of the method, the first supply voltage is greater than the second supply voltage.

In one alternative embodiment of the method, the first supply voltage is less than the second supply voltage.

Therefore, the described method can be used in order to increase or to decrease the level of the digital input data signal.

BRIEF DESCRIPTION OF THE DRAWINGS

The invention will be explained in more detail below using several embodiments with reference to the figures. Components and circuit parts that have identical functions or identical effects carry identical reference symbols. Insofar as circuit parts or components correspond in their function, their description will not be repeated in each of the following figures. Shown are.

DETAILED DESCRIPTION OF THE DRAWINGS

Figure 1:
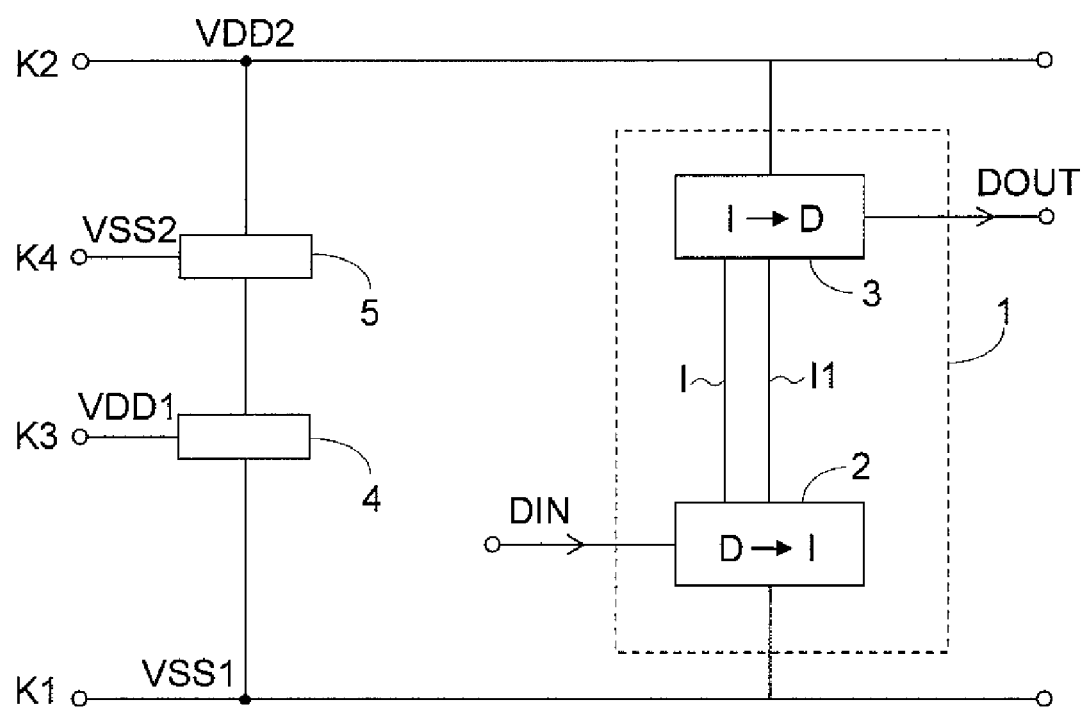
FIG. 1 an example embodiment of a circuit arrangement for shifting a voltage level according to the invention, FIG. 2 an example embodiment of a circuit arrangement for shifting a voltage level from a low supply voltage range into a higher supply voltage range for three binary information values, FIG. 3 an example embodiment of a circuit arrangement for shifting a voltage level from a higher supply voltage range into a lower supply voltage range for three binary information values.

FIG. 1 shows an example embodiment of a circuit arrangement for shifting a voltage level according to the invention.

The circuit arrangement comprises a voltage level shifter 1, a supply potential regulator 4, and also a reference potential regulator 5. The voltage level shifter 1 is connected between a first connection K1 to which a first reference potential VSS1 is applied and a second connection K2 to which a second supply potential VDD2 is applied. The supply potential regulator 4 is connected between the first connection K1 and the reference potential regulator 5 and provides the first supply potential VDD1 on a third connection K3. Thus the first supply voltage is applied between the third connection K3 and the first connection K1. The reference potential regulator 5 is connected between the second connection K2 and the supply potential regulator 4 and provides a second reference potential VSS2 on a fourth connection K4. Thus the second supply voltage is applied between the second connection K2 and the fourth connection K4. The voltage level shifter 1 comprises a data-current converter 2 and a current-data converter 3. The data-current converter 2 is connected to the first connection K1 and has an input for feeding a digital input data signal DIN, a first output for providing a current I, and also a second output for providing a reference current I1. The current-data converter 3 is connected to the second connection K2 and has a first input for feeding the current I, a second input for feeding the reference current I1, and also an output for providing a digital output data signal DOUT. The digital input data signal DIN comprises a number of binary information values whose logic state zero is represented by the first reference potential VSS1 and whose logic state one is represented by the first supply potential VDD1. The digital input data signal DIN is thus in the range of the first supply voltage. The digital output data signal DOUT comprises a number of binary information values, with this number corresponding to the number of binary information values of the digital input data signal DIN. The logic state zero of the binary information values of the digital output data signal DOUT is presented by the second reference potential VSS2, the logic state one of the binary information values of the digital output data signal DOUT is presented by the second supply potential VDD2. The digital output data signal DOUT is thus provided in the range of the second supply voltage. The number of binary information values can be arbitrarily large. Here, the first supply voltage can be larger or smaller than the second supply voltage.

The supply voltage regulator 4 regulates the first supply potential VDD1 such that the first supply voltage is stable. The reference potential regulator 5 regulates the second reference potential VSS2 such that the second supply voltage is stable. The data-current converter 2 converts the binary information values of the digital input data signal DIN with respect to the reference current I1 into weighted partial currents. These are summed and provided on the first output of the data-current converter 2 as current I. The current I and the reference current I1 are transformed from the level range of the first supply voltage to the level range of the second supply voltage. For this purpose, for example, a cascade is used in each case as a high-voltage element. The current-data converter 3 decodes the current I with respect to the reference current T1 into the binary information values of the digital output data signal DOUT. Here, the information contained in the binary information values of the digital input data signal DIN is preserved and converted one to one into the binary information values of the digital output data signal DOUT.

All of the binary information values of the digital input data signal DIN are contained in the current I. Thus, only the current I and the reference current I1 must be transformed from the range of the first supply voltage to the range of the second supply voltage. For this purpose, only two high-voltage elements, for example, cascodes, are required. This represents a significant reduction of the chip surface area in comparison with conventional circuit arrangements in which one high-voltage element is required for each binary information value.

The circuit arrangement is independent of the different supply voltages. The voltage of the digital output data signal DOUT is automatically adapted to the second supply voltage.

Figure 2:
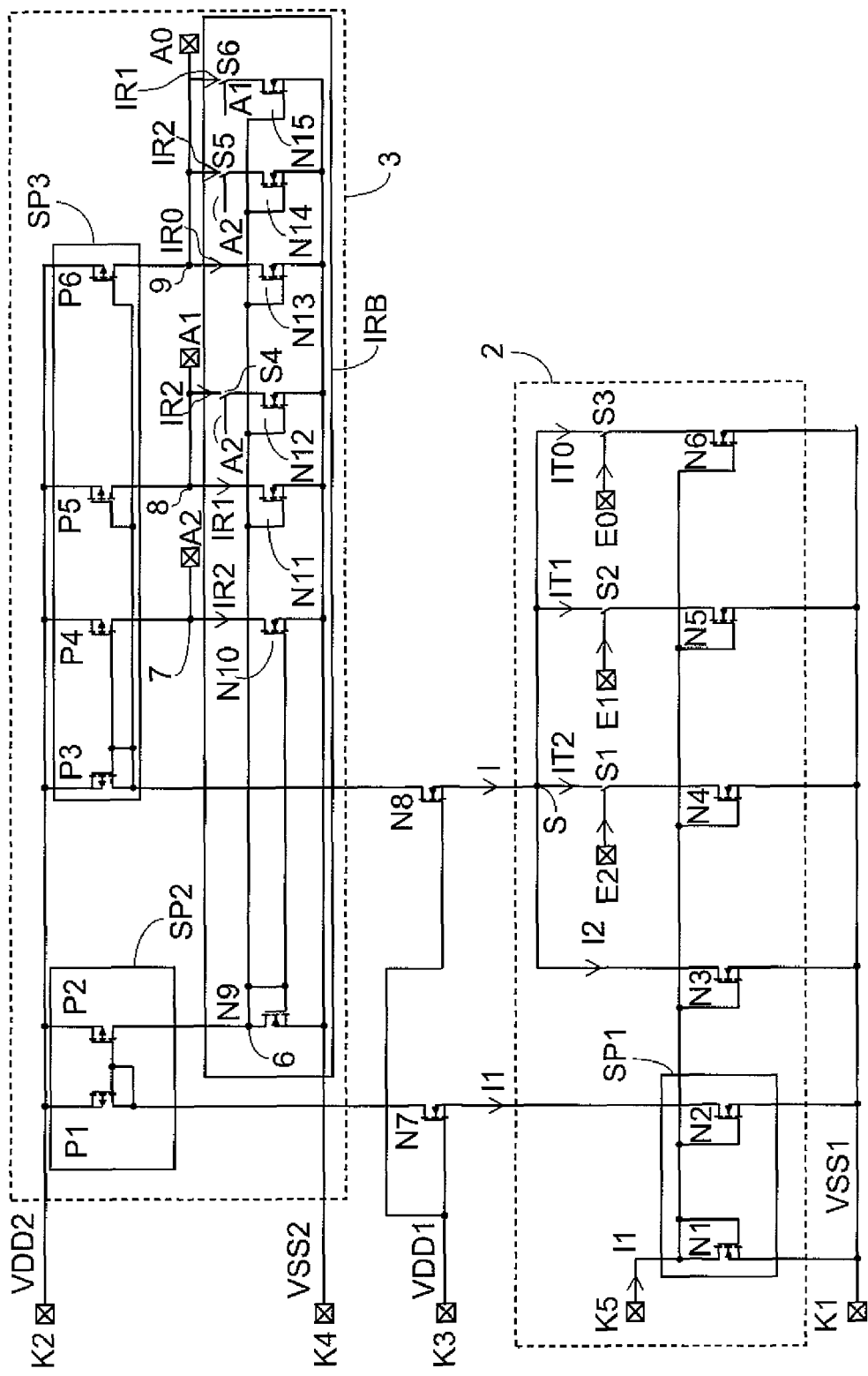

FIG. 2 shows an example embodiment of a circuit arrangement for shifting a voltage level from a low supply voltage range into a higher supply voltage range for three binary information values. The circuit arrangement comprises the data-current converter 2, the current-data converter 3, and also two high-voltage elements N7 and N8. The first supply voltage applied between the third and the first connections K3 and K1 of the circuit arrangement here has a lower level than the second supply voltage applied between the fourth and the second connection K4 and K2. The data-current converter 2 has a connection K5 for feeding the reference current I1, a sum point S for providing the current I, and also an output for providing the reference current I1. In addition, the data-current converter 2 has three inputs for feeding three binary information values E0, E1, and E2. The data-current converter 2 comprises a current mirror SP1, four self-blocking n-channel field-effect transistors N3, N4, N5, and N6, and also three switches S1, S2, and S3. Each gate connection of the transistors N3, N4, N5, and N6 is coupled with the connection K5. Each source and each bulk connection of the transistors N3, N4, N5, and N6 are coupled with the first connection K1. A drain connection of the transistor N3 is connected to the sum point S. A drain connection of the transistor N4 is coupled via the switch S1 and a drain connection of the transistor N5 is coupled via the switch S2 and a drain connection of the transistor N6 is coupled via the switch S3 with the sum point S. The current mirror SP1 has two self-blocking n-channel field-effect transistors N1 and N2. Each gate connection of the transistors N1 and N2 is connected to the connection K5. Each source connection and each bulk connection of the transistors N1 and N2 are coupled with the first connection K1 of the circuit arrangement. A drain connection of the transistor N1 is coupled with the connection K5. A drain connection of the transistor N2 forms the output of the data-current converter 2.

The current mirror SP1 provides the reference current I1 on the output of the data-current converter 2. The transistors N3, N4, N5, and N6 are each operated as current sources. The transistors are here dimensioned as follows: the transistor N3 generates, on its drain connection, an offset current I2 at the value of half the reference current I1; the transistor N4 generates, on its drain connection, a partial current IT2 at four times the reference current I1; the transistor N5 generates, on its drain connection, a partial current IT1 at the value of twice the reference current I1; and the transistor N6 generates, on its drain connection, a partial current IT0 at the value of the reference current I1. Here, the switch S1 is controlled by the binary information value E2. The switch S2 is controlled by the binary information value E1; the switch S3 is controlled by the binary information value E0. The switches S1, S2, and S3 are closed when the appropriate controlling binary information value assumes the logic state one. Thus, at the sum point S the current I is available which is assembled from the partial currents IT0, IT1, and IT2, as well as the offset current I2, as follows:

$$I=I2+IT2+IT1+IT0,$$

where I represents the current I, I2 the offset current I2, IT2 the partial current IT2, IT1 the partial current IT1, and IT0 the partial current IT0.

Wherein:

$$I2=1/2I1, IT2=E2*4*I1, IT1=E1*2*I1, IT0=E0*I1,$$

where I1 represents the reference current I1, E2 the binary information value E2, E1 the binary information value E1, and E0 the binary information value E0.

The high-voltage elements N7 and N8 each comprise a self-blocking n-channel field-effect transistor operating as a cascode. Here, each gate connection of the high-voltage elements N7 and N8 is coupled with the third connection K3 of the circuit arrangement. Each drain connection of the high-voltage elements N7 and N8 is connected in each case to an input of the current-data converter 3. A source connection and a bulk connection of the high-voltage element N7 are coupled with the output of the data-current converter 2. A source connection and a bulk connection of the high-voltage element N8 are coupled with the sum point S. The current I is fed via the high-voltage element N8, the reference current I1 is fed via the high-voltage element N7 to the current-data converter 3.

The current-data converter 3 comprises a current mirror SP2, a current mirror SP3, and an element IRB. The current-data converter 3 has three outputs for providing three binary information values A0, A1, and A2 of the binary output signal DOUT. The current mirror SP2 comprises two self-blocking p-channel field-effect transistors P1 and P2. A gate connection of the transistor P1 is connected to a gate connection of the transistor P2. The connected gate connections of the transistors P1 and P2 form, coupled with a drain connection of the transistor P1, the input of the current mirror SP2 for feeding the reference current I1. Each source connection and each bulk connection of the transistors P1 and P2 are connected to the second connection K2 of the circuit arrangement. A drain connection of the transistor P2 forms a node 6 as an output of the current mirror SP2 at which the reference current I1 is provided. The current mirror SP3 comprises four self-blocking p-channel field-effect transistors P3, P4, P5, and P6. Each gate connection of the transistors P3, P4, P5, and P6 is coupled with the drain connection of the high-voltage element N8. Each source connection and each bulk connection of the transistors P3, P4, P5, and P6 are connected to the second connection K2 of the circuit arrangement. A drain connection of the transistor P3 is connected to the drain connection of the high-voltage element N8 and forms the input of the current mirror SP3 for feeding the current I. A drain connection of the transistor P4 forms the node 7. A drain connection of the transistor P5 forms the node 8. A drain connection of the transistor P6 forms the node 9. At the nodes 7, 8, and 9, the current I is provided, respectively. The element IRB comprises seven self-blocking n-channel field-effect transistors N9, N10, N11, N12, N13, N14, and N15, as well as three switches S4, S5, and S6. Here, each gate connection of the transistors N9 to N15 is connected to the node 6. Each source connection and each bulk connection of the transistors N9 to N15 are connected to the fourth connection K4 of the circuit arrangement. A drain connection of the transistor N9 is connected to the node 6 and forms the input of the element IRB for feeding the reference current I1. A drain connection of the transistor N10 forms a first output of the element IRB for providing a comparison current IR2. The first output of the element IRB is connected to the node 7. The transistor N10 is designed so that the provided comparison current IR2 equals four times the reference current I1. A drain connection of the transistor N11 forms a second output of the element IRB for providing a comparison current IR1. The second output of the element IRB is connected to the node 8. The transistor N11 is here designed so that the provided comparison current IR1 equals twice the reference current I1. A drain connection of the transistor N12 is connected to the node 8 by means of the switch S4. The transistor N12 is here designed so that it generates the comparison current IR2. The switch S4 is controlled by the binary information value A2 so that the switch S4 is closed when the binary information value A2 assumes the logic state one. A drain connection of the transistor N13 forms a third output of the element IRB for providing a comparison current IR0. The third output of the element IRB is connected to the node 9. The transistor N13 is designed so that the generated comparison current IR0 is exactly as large as the reference current I1. A drain connection of the transistor N14 is connected to the node 9 by means of the switch S5. The transistor N14 is designed so that it likewise generates the comparison current IR2. The switch S5 is controlled by the binary information value A2 so that the switch S5 is closed when the binary information value A2 assumes the logic state one. A drain connection of the transistor N15 is coupled with the node 9 via the switch S6. The transistor N15 is designed so that it likewise generates the comparison current IR1. The switch S6 is controlled by the binary information value A1 so that the switch S6 is closed when the binary information value A1 assumes the logic state one.

The transistors P4 and N10 form a current comparator for the binary information value A2 provided on the node 7 as a result. The transistors P5 and also N11 and N12 form a current comparator for the binary information value A1 provided on node 8 as a result. The transistors P6 and also N13, N14, and N15 form a current comparator for the binary information value A0 provided on node 9 as a result. The larger current here in each case defines the potential of the respective node. At the node 7, the current I is compared with the comparison current IR2. If the current I is greater than the comparison current IR2, then the potential of the node 7 is pulled to the potential of the second connection K2 of the circuit arrangement, that is, the second supply potential VDD2. The binary information value A2 provided on node 7 then assumes the logic state one. If the current I is less than the comparison current IR2, then the potential of the node 7 is pulled to the potential of the fourth connection K4 of the circuit arrangement, that is, to the second reference potential VSS2. The binary information value A2 assumes, in this case, the logic state zero. At the node 8, the current I is compared with the sum of the comparison current IR1 and the comparison current IR2 controlled by the binary information value A2. Here, the larger current defines the potential of the node 8 and thus the logic state of the binary information value A1 provided on node 8. Here:

$A1=1$, if $I \geq IR1+A2*IR2$, otherwise $A1=0$, where A1 represents the binary information value A1, IR1 the comparison current IR1, A2 the binary information value A2, and IR2 the comparison current IR2.

At the node 9, the current I is compared with the sum of the comparison current IR0, the comparison current IR2 controlled via the switch S5 by the binary information value A2, and the comparison current IR1 controlled via the switch S6 by the binary information value A1 according to the following rule:

$A0=1$, if $I \geq IR0+A1*IR1+A2*IR2$, otherwise $A0=0$, wherein A0 represents the binary information value A0 and IR0 the comparison current IR0.

The function of the circuit is made even clearer using the following example with numbers. The reference current I1 equals 2.5 µA. The binary information value E0 is at the logic state one, the binary information value E1 is at the logic state zero, and the binary information value 52 is at the logic state one. The offset current I2 equals 1.25 µA. Thus, the partial current IT2 equals 10 µA, the partial current IT1 equals 0 µA, and the partial current IT0 equals 2.5 µA. For the current I, a value of 13.75 µA is given at the sum point S. The comparison current IR0 equals 2.5 µA, the comparison current IR1 equals 5 µA, and the comparison current IR2 equals 10 µA. Thus, at node 7, 13.75 µA is compared with 10 µA and the binary information value A2 assumes the logic state one. At node 8, the sum of the comparison currents IR1 and IR2 equals 15 µA. These are compared with the 13.75 µA of current I. The binary information value A1 thus assumes the potential of the fourth connection K4 of the circuit arrangement, that is, the logic state zero. At node 9, the sum of the comparison currents, namely 12.5 µA, is compared with the 13.75 µA of current I. Thus, the node 9 assumes the potential of the second connection K2 of the circuit arrangement, that is, the second supply potential. The binary output value A0 thus assumes the logic state one.

The circuit arrangement merely requires two high-voltage elements N7 and N8. This represents a significant saving of surface area. Current I is decoded by means of current comparators exclusively in the current domain. This allows direct decoding into the binary information values A0, A1, and A2. No additional digital logic or Schmitt trigger is required. Because the information of the binary information values E0, E1, and E2 is contained in current I, the circuit arrangement operates independent of the height of the first or second supply voltage. The voltage range of the binary information values A0, A1, and A2 automatically adapts to the second supply voltage. The maximum voltage level for the logic state one of the binary information values A0, A1, and A2 of the digital output data signal DOUT is here defined by the maximum drain-source voltage of the two high-voltage elements N7 and N8.

The circuit arrangement can also be realized in bipolar technology. Here, all of the transistors are replaced by bipolar transistors of the corresponding type.

Figure 3:
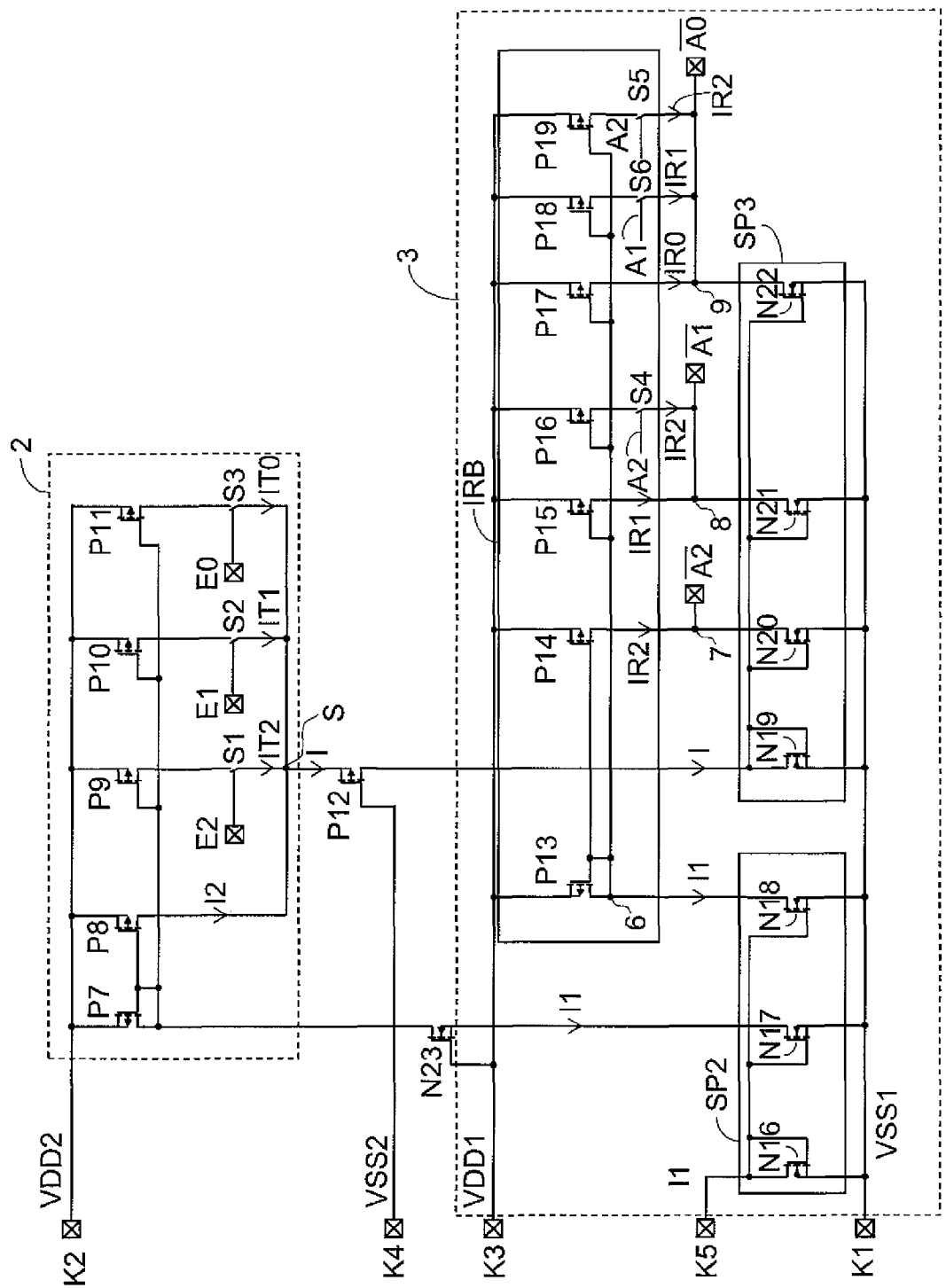

FIG. 3 shows an example embodiment of a circuit arrangement for shifting a voltage level from a higher supply voltage range into a lower supply voltage range for three binary information values. Here, the binary information values 50, E1, and E2 of the digital input data signal DIN are in the range of the second supply voltage. The binary information values A0, A1, and A2 of the digital output data signal DOUT are provided in the voltage range of the first supply voltage. Here, the first supply voltage lies between the third connection K3 and the first connection K1 of the circuit arrangement and has a lower level than the second supply voltage applied between the second connection K2 and the fourth connection K4 of the circuit arrangement. The circuit arrangement comprises the data-current converter 2, the current-data converter 3, a high-voltage element N23, and also a high-voltage element P12. The data-current converter 2 is coupled with the second connection K2 of the circuit arrangement and has three inputs for feeding the three binary information values 50, E1, and E2, an output for providing the reference current I1, and also the sum point S for providing the current I. The current-data converter 3 is coupled with the first connection K1 of the circuit arrangement and has a first input for feeding the current I, a second input for feeding the reference current I1, and also three outputs for providing the three binary information values A0, A1, and A2. The high-voltage element P12 has a self-blocking p-channel field-effect transistor that is operated as a cascode and whose gate connection is connected to the fourth connection K4 of the circuit arrangement and whose source connection and bulk connection are connected to the sum point S and whose drain connection is connected to the first input of the current-data converter 3. The high-voltage element N23 comprises a self-blocking n-channel field-effect transistor that is operated as a cascode and whose gate connection is connected to the third connection K3 of the circuit arrangement and whose drain connection is connected to the output of the data-current converter 2 and whose source connection and bulk connection are connected to the second input of the current-data converter 3. The high-voltage element P12 transforms the current I from the range of the higher supply voltage, that is, the second supply voltage, to the range of the lower first supply voltage. The high-voltage element N23 transforms the reference current I1 from the range of the higher second supply voltage to the range of the lower first supply voltage. The data-current converter 2 has five transistors P7, P8, P9, P10, and P11, as well as three switches S1, S2, and S3. Each source connection and each bulk connection of the transistors P7 to P11 are connected to the second connection K2 of the circuit arrangement. Each gate connection of the transistors P7 to P11 is connected to the output of the data-current converter 2. A drain connection of the transistor P7 is likewise coupled with the output of the data-current converter 2. A drain connection of the transistor P8 is connected to the sum point S. A drain connection of the transistor P9 is connected via the switch S1 to the sum point S. A drain connection of the transistor P10 is connected via the switch S2 to the sum point S. A drain connection of the transistor P11 is connected via the switch S3 to the sum point S. The transistors P8 to P11 are dimensioned as current sources equivalent to the transistors N3 to NG from FIG. 2. The function of the switches S1 to S3 corresponds to the function of the same switches in FIG. 2. The transistor P8 generates the offset current I2 at half the reference current I1, the transistor P9 generates the partial current IT2 at four times the reference current I1, the transistor P10 generates the partial current IT1 at twice the reference current I1, and the transistor P11 generates the partial current IT0 at the reference current I1. At the sum point S, the partial currents IT0, IT1, 1T2 and the offset current I2 are added to current I corresponding to the function described in FIG. 2. Here, again:

$$I=I2+E2*4*I1+E1*2*I1+E0*I1.$$

The current-data converter 3 comprises the current mirror SP2, the current mirror SP3, and also the element IRB. The current mirror SP2 comprises three self-blocking n-channel field-effect transistors N16, N17, and N18. Each gate connection of the transistors N16 to N18 is connected to the connection K5 of the circuit arrangement. Each source connection and each bulk connection of the transistors N16 to N18 are each connected to the first connection K1 of the circuit arrangement. The reference current I1 that is mirrored onto each drain connection of the transistors N17 and N18 is fed to a drain connection of the transistor N16. The current mirror SP3 has four self-blocking n-channel field-effect transistors N19, N20, N21, and N22. Each gate connection of the transistors N19 to N22 is connected to the first input of the current-data converter 3. Each source connection and each bulk connection of the transistors N19 to N22 are each connected to the first connection K1 of the circuit arrangement. The current I fed via a drain connection of the transistor 19 is mirrored onto each drain connection of the transistors N20 to N22 and thus onto the nodes 7, 8, and 9. The element IRB comprises seven self-blocking p-channel field-effect transistors P13, P14, P15, P16, P17, P18, and P19, and also three switches S4, S5, and S6. Each source connection and each bulk connection of the transistors P13 to P19 are each connected to the third connection K3 of the circuit arrangement. Each gate connection of the transistors P13 to P19 is connected to the node 6. The reference current I1 is fed to the transistor P13 via its drain connection. The transistors P14 to P19 operate equivalent to the transistors N10 to N15 from FIG. 2 as current sources and generate the comparison currents IR0, IR1, and IR2. Here, the transistors P14, P16, and P19 are dimensioned so that they generate, at their drain connections, the comparison current IR2 at four times the reference current I1. The transistors P15 and P18 are dimensioned so that they provide, at their drain connections, the comparison current IR1 at twice the reference current I1. The transistor P17 is dimensioned so that it generates, at its drain connection, the comparison current IR0 at the reference current I1. Thus, equivalent to the circuit arrangement in FIG. 2 at nodes 7, 8, and 9, the current I is compared with the sum of the applied comparison currents. The switches S4 and S6 are controlled by the binary information value A2 as described in FIG. 2. The switch S5 is controlled by the binary information value A1 as described in FIG. 2. The inverted binary information value $\overline{A2}$ is provided at node 7, the inverted binary information value $\overline{A1}$ is provided at node 8, and the inverted binary information value $\overline{A0}$ is provided at node 9. When the currents are compared, the greater current defines the potential of the corresponding node and thus the logic state of the provided binary information value. The inverted binary information values are provided according to the following rules:

$$\overline{A2}=0, \text{ if } I \geq IR2, \text{ otherwise } \overline{A2}=1,$$

$$\overline{A1}=0, \text{ if } I \geq IR1+A2*IR2, \text{ otherwise } \overline{A1}=1,$$

$$\overline{A0}=0, \text{ if } I \geq IR0+A1*IR1+A2*IR2, \text{ otherwise } \overline{A0}=1,$$

where $\overline{A2}$ represents the inverted binary information value $\overline{A2}$, $\overline{A1}$ the inverted binary information value $\overline{A1}$, and $\overline{A0}$ the inverted binary information value $\overline{A0}$.

For transforming the binary information values E0 to E2 from the range of the higher, second supply voltage to the range of the lower, first supply voltage, again only the two high-voltage elements N23 and P12 are needed.

The circuit arrangement may also be realized using bipolar technology. For this, all of the transistors are replaced by bipolar transistors of the corresponding type.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A circuit arrangement for shifting a voltage level comprising a data-current converter that is connected to a first connection and that has an input for feeding a digital input data signal, a first output for providing a current, and also a second output for providing a reference current and a current-data converter that is connected to a second connection and that has a first input for feeding the current, a second input for feeding the reference current, and also an output for providing a digital output data signal, wherein a voltage level of the digital output data signal is different from a voltage level of the digital input data signal.

2. The circuit arrangement according to claim 1,
wherein the digital input data signal is a binary signal and has a first and at least one second binary information value whose corresponding logic state zero in each case is represented by a first reference potential applied to the first connection of the circuit arrangement and whose corresponding logic state one in each case is represented by a first supply potential that is applied to a third connection of the circuit arrangement and that is higher than the first reference potential.

3. The circuit arrangement according to claim 1, wherein the digital output data signal is a binary signal and has a number of binary information values corresponding to the number of binary information values of the digital input data signal, wherein the logic state one of the binary information values of the digital output data signal is represented by a second supply potential applied to the second connection of the circuit arrangement and the logic state zero of the binary information values of the digital output data signal is represented by a second reference potential applied to a fourth connection of the circuit arrangement.

4. The circuit arrangement according to claim 1, wherein the data-current converter is designed for providing the current as a function of the reference current and an offset current according to the rule:

$$I=I2+E0*2^0*I1+E1*2^1*I1,$$

where E0 represents the first binary information value of the digital input data signal, E1 the at least one second binary information value of the digital input data signal, I the current, I1 the reference current, and I2 the offset current.

5. The circuit arrangement according to claim 4, wherein the current-data converter is designed for providing the first and the at least one second binary information values of the digital output data signal as a function of the reference current and the current according to the following rules:

$$A0=1, \text{ if } I \geq 2*I1+A1*2*I1, \text{ otherwise } A0=0,$$

$$A1=1, \text{ if } I \geq 2*I1, \text{ otherwise } A1=0,$$

where A0 represents the first binary information value and A1 the at least one second binary information value of the digital output data signal.

6. The circuit arrangement according to claim 5, wherein the current-data converter is configured for providing the digital output data signal as a function of the current and the reference current so that a logic state of the first binary information value of the digital output data signal agrees with a logic state of the first binary information value of the digital input data signal and a logic state of the at least one second binary information value of the digital output data signal agrees with a logic state of the at least one second binary information value of the digital input data signal.

7. The circuit arrangement according to claim 6, wherein the current-data converter has a number of current comparators corresponding to the number of provided binary information values of the digital output data signal.

8. The circuit arrangement according to claim 1, wherein a high-voltage element is connected before the first and the second input of the current-data converter for transforming the current and the reference current into the level range of the second supply potential.

9. The circuit arrangement according to claim 8, wherein the high-voltage element in each case has at least one component from a group that comprises a transistor or a cascode circuit with two transistors.

10. A method for shifting a voltage level comprising the steps of:
converting a first and at least one second binary information values of a digital input data signal provided in the level range of a first supply voltage to a first and at least one second weighted partial current with the help of a reference current;
adding a first and the at least one second partial currents to a current;
transforming the current and the reference current to the level range of a second supply voltage; and
back converting the current with the help of the reference current to a first and at least one one second binary information values of a digital output data signal in the level range of the second power-supply voltage.

11. The method according to claim 10, wherein a logic state of the first binary information value of the digital input data signal agrees with a logic state of the first binary information value of the digital output data signal and a logic state of the at least one second binary information value of the digital input data signal agrees with a logic state of the at least one second binary information value of the digital output data signal.

12. The method according to claim 10, wherein exactly one high-voltage element is used for transforming each of the current and the reference current to the range of the second supply voltage.

13. The method according to claim 10, wherein the high-voltage element in each case has at least one component from a group that comprises a transistor and a cascode circuit with two transistors.

14. The method according to claim 10, wherein at least one current comparator for each of the first and the at least one second binary information values of the digital output data signal is used for the back conversion of the current.

15. The method according to claim 10, wherein the first supply voltage is greater than the second supply voltage.

16. The method according to claim 10, wherein the first supply voltage is less than the second supply voltage.

* * * * *